(12) United States Patent
Rexer et al.

(10) Patent No.: US 8,362,550 B2
(45) Date of Patent: Jan. 29, 2013

(54) TRENCH POWER MOSFET WITH REDUCED ON-RESISTANCE

(75) Inventors: Christopher L. Rexer, Mountain Top, PA (US); Ritu Sodhi, Maharashtra (IN)

(73) Assignee: Fairchild Semiconductor Corporation, San Jose, CA (US)

( * ) Notice: Subject to any disclaimer, the term of this patent is extended or adjusted under 35 U.S.C. 154(b) by 24 days.

(21) Appl. No.: 13/158,927

(22) Filed: Jun. 13, 2011

(65) Prior Publication Data

US 2012/0187474 A1     Jul. 26, 2012

Related U.S. Application Data

(60) Provisional application No. 61/434,712, filed on Jan. 20, 2011.

(51) Int. Cl.
*H01L 29/78* (2006.01)

(52) U.S. Cl. ........... 257/330; 257/E29.262; 257/E21.41; 438/270

(58) Field of Classification Search .................. 257/330, 257/E29.262, E21.41; 438/270
See application file for complete search history.

(56) References Cited

U.S. PATENT DOCUMENTS

| | | | |
|---|---|---|---|
| 4,941,026 A | 7/1990 | Temple | |
| 5,679,966 A | 10/1997 | Baliga et al. | |
| 5,998,833 A | 12/1999 | Baliga | |
| 6,683,346 B2 | 1/2004 | Zeng | |
| 7,489,011 B2 * | 2/2009 | Yilmaz | 257/409 |
| 7,504,303 B2 * | 3/2009 | Yilmaz et al. | 438/259 |
| 7,504,306 B2 | 3/2009 | Sapp et al. | |
| 7,625,793 B2 | 12/2009 | Calafut | |
| 7,638,841 B2 * | 12/2009 | Challa | 257/341 |
| 7,825,465 B2 * | 11/2010 | Pan et al. | 257/332 |
| 2005/0167742 A1 | 8/2005 | Challa et al. | |
| 2008/0135931 A1 | 6/2008 | Challa et al. | |

* cited by examiner

*Primary Examiner* — Trung Q Dang

(57) ABSTRACT

A semiconductor device includes a drift region, a well region extending above the drift region, an active trench including sidewalls and a bottom, the active trench extending through the well region and into the drift region and having at least portions of its sidewalls and bottom lined with dielectric material. The device further includes a shield disposed within the active trench and separated from the sidewalls of the active trench by the dielectric material, a gate disposed within the active trench above the first shield and separated therefrom by inter-electrode dielectric material, and source regions formed in the well region adjacent the active trench. The gate is separated from the sidewalls of the active trench by the dielectric material. The shield and the gate are made of materials having different work functions.

30 Claims, 7 Drawing Sheets

TRENCH POWER MOSFET WITH REDUCED ON-RESISTANCE

CROSS-REFERENCE TO RELATED APPLICATIONS

This application claims the benefit of U.S. Provisional Appln. No. 61/434,712, filed Jan. 20, 2011, which is incorporated by reference in its entirety for all purposes.

BACKGROUND

The present invention relates to semiconductor power device technology and more particularly to improved trench vertical MOSFET devices and fabrication processes for forming such devices.

Semiconductor packages are well known in the art. These packages can sometimes include one or more semiconductor devices, such as an integrated circuit (IC) device, die or chip. The IC devices can include electronic circuits that have been manufactured on a substrate made of semiconductor material. The circuits are made using many known semiconductor processing techniques such as deposition, etching photolithography, annealing, doping and diffusion. Silicon wafers are typically used as the substrate on which these IC devices are formed.

An example of a semiconductor device is a metal oxide silicon field effect transistor (MOSFET) device, which is used in numerous electronic apparatuses including power supplies, automotive electronics, computers and disc drives. MOSFET devices can be used in a variety of application such as switches that connect power supplies to particular electronic devices having a load. MOSFET devices can be formed in a trench that has been etched into a substrate or onto an epitaxial layer that has been deposited onto a substrate.

MOSFET devices operate by applying an appropriate threshold voltage to a gate electrode of a MOSFET device which turns the device ON and forms a channel connecting a source and a drain of the MOSFET allowing a current to flow. Once the MOSFET device is turned on, the relation between the current and the voltage is nearly linear which means that the device behaves like a resistor. When the MOSFET device is turned OFF (i.e. in an off state), the voltage blocking capability is limited by the breakdown voltage. In high power applications, it is desirable to have a high breakdown voltage, for example, 600V or higher, while still maintaining low on state specific resistance Rsp.

Techniques that are employed to achieve threshold voltages in the range for useful operation (i.e. preventing channel accumulation at zero applied gate voltage) can reduce on state specific resistance. Therefore, what is needed is a cost effective way of reducing on state specific resistance while still achieving threshold voltages that are in a range for useful operation.

BRIEF SUMMARY

Embodiments provide rugged trench power MOSFETS with reduced on state specific resistance. The trench power MOSFET has an active trench that includes a shield, a gate and an inter-electrode dielectric. The shield and the gate are separated by an inter-electrode dielectric. The shield and the gate are made of materials having different work functions.

In one embodiment, a semiconductor device includes a drift region of a first conductivity type, a well region extending above the drift region and having a second conductivity type opposite the first conductivity type, an active trench including sidewalls and a bottom, the active trench extending through the well region and into the drift region and having at least portions of its sidewalls and bottom lined with dielectric material. The device further includes a first shield disposed within the active trench and separated from the sidewalls of the active trench by the dielectric material, a gate disposed within the active trench above the first shield and separated therefrom by inter-electrode dielectric material, and source regions having the first conductivity type formed in the well region adjacent the active trench. The gate is separated from the sidewalls of the active trench by the dielectric material. The first shield and the gate are made of materials having different work functions.

In another embodiment, the first shield includes N-type polysilicon and the gate includes P-type polysilicon. The drift region can be an epitaxially grown P-type material. The N-type polysilicon material in the first shield can provide an accumulation layer along the trench adjacent to the drift region.

In another embodiment, the first shield includes an N-type polysilicon and the gate includes a metal.

In another embodiment, the first shield includes P-type polysilicon and the gate includes N-type polysilicon. The drift region can be an epitaxially grown N-type material. The P-type polysilicon material in the first shield can provide an accumulation layer along the trench adjacent to the drift region.

In another embodiment, the drift region is formed over a substrate and the active trench extends into the substrate.

In another embodiment, the first conductivity type is p-type.

In another embodiment, the inter-electrode dielectric material has a thickness that is thicker than the dielectric material.

In another embodiment, the inter-electrode dielectric material is the same as the dielectric material.

In another embodiment, the first shield inside the active trench is configured to be electrically biased to a desired potential.

In another embodiment, the first shield and the source regions are configured to be electrically coupled to substantially the same potential.

In another embodiment, the first shield and the gate are configured to be electrically coupled to substantially the same potential.

In another embodiment, the first shield includes N-type polysilicon and the gate includes P-type polysilicon. The active trench further includes a second shield and the second shield includes an N-type polysilicon material disposed below the first shield. The first and second shields can vary in thickness. The first and second shields can vary in width. The first and second shields can also be configured to be independently biased.

In another embodiment, the first shield includes N-type polysilicon and the gate includes P-type polysilicon. The active trench further includes a plurality of second shields disposed below the first shield, the plurality of second shields being stacked below the first shield. The plurality of second shields can all be N-type polysilicon material.

In another embodiment, the shield inside the active trench forms a secondary gate electrode that is configured to be electrically biased to a desired potential. The gate and the secondary gate electrode can be configured to be independently electrically biased. The secondary gate electrode can also be configured to be biased at a constant potential at approximately the threshold voltage of the semiconductor device. The secondary gate electrode can be configured to be biased at a potential that is greater than a potential applied to the source regions. The secondary gate electrode can be configured to be coupled to a potential at approximately the threshold voltage of the semiconductor device before a switching event. The active trench can further include a third conductive layer disposed under the secondary gate electrode, the third conductive layer being isolated from the secondary gate electrode and the trench sidewalls and bottom by dielectric material. The third conductive layer forms a shield electrode that is configured to be electrically biased to a desired potential.

In another embodiment, a semiconductor device includes a drift region made of an epitaxially grown p-type conductivity material, a well region extending above the drift region and having an n-type conductivity material, an active trench including sidewalls and a bottom. The active trench extends through the well region and into the drift region. The active trench has at least portions of its sidewalls and bottom lined with dielectric material. The semiconductor device further includes a first shield disposed within the active trench and separated from the sidewalls of the active trench by the dielectric material, a gate disposed within the active trench above the first shield and separated therefrom by inter-electrode dielectric material, and source regions having the n-type conductivity material formed in the well region adjacent the active trench. The first shield includes an N-type polysilicon material. The gate is separated from the sidewalls of the active trench by the dielectric material. The gate includes a material different than the first shield material.

In another embodiment, the drift region is formed over a substrate and the active trench extends into the substrate.

In another embodiment, the gate includes a P-type polysilicon material.

In another embodiment, the gate includes a metal material.

In another embodiment, the N-type polysilicon material in the first shield provides an accumulation layer along the trench adjacent to the drift region.

In another embodiment, the inter-electrode dielectric material has a thickness that is thicker than the dielectric material.

In another embodiment, the inter-electrode dielectric material is the same as the dielectric material.

In another embodiment, a method of forming a semiconductor device includes forming a drift region of a first conductivity type, forming a well region extending above the drift region, the well region having a second conductivity type opposite the first conductivity type. The method also includes forming an active trench extending through the well region and into the drift region, the active trench including sidewalls and a bottom. The method further includes lining portions of the active trench sidewalls and bottom with a dielectric material, forming a shield including an N-type polysilicon material within the active trench and separated from the sidewalls of the active trench by the dielectric material, forming an inter-electrode dielectric material over the shield in the active trench, forming a gate within the active trench above the shield and separated therefrom by the inter-electrode dielectric material, and forming source regions in the well region adjacent the active trench. The gate is separated from the sidewalls of the active trench by the dielectric material. The gate includes a material different than the shield material. The source regions are first conductivity type.

In another embodiment, the method further includes forming the drift region over a substrate and forming the active trench to extend into the substrate.

In another embodiment, the method of forming the gate includes forming a P-type polysilicon material in the active trench.

In another embodiment, the method of forming the gate includes forming a metal material in the active trench.

In another embodiment, the method of forming the drift region further includes epitaxially growing p-type material.

In another embodiment, the method of forming an inter-electrode dielectric material further includes depositing the inter-electrode dielectric material that has a thickness that is thicker than the dielectric material.

In another embodiment, the method of forming an inter-electrode dielectric material further includes depositing the inter-electrode dielectric material that has a thickness that is the same as the dielectric material.

In another embodiment, the method of forming an inter-electrode dielectric material further includes forming an inter-electrode dielectric material that is thinner than the dielectric material.

In another embodiment, the method of forming an inter-electrode dielectric material further includes using oxidation.

In another embodiment, the method of forming an inter-electrode dielectric material further includes using oxidation and deposition.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

DETAILED DESCRIPTION

In the following description, for the purposes of explanation, specific details are set forth in order to provide a thorough understanding of the invention. However, it will be apparent that the invention may be practiced without these specific details.

Embodiments allow for the fabrication of trench power MOSFET with reduced on-resistance. Embodiments also provide for trench power MOSFET devices that are rugged by forming a thicker dielectric layer between the gate and shield poly, thereby making the gate of the device more rugged for maximum voltage rating.

In embodiments, a P-channel trench charge balance MOSFET includes a trench, at least one shielding polysilicon region and at least one gate region. At least one of the shielding polysilicon regions, which is located near P epi portions of the MOSFET, is doped N-type material. Additionally, at least one gate region includes of P-typed doped polysilicon. Alternatively, at least one gate region includes metal.

In embodiments, a semiconductor device includes a drift region of a first conductivity type, a well region extending above the drift region and having a second conductivity type opposite the first conductivity type, an active trench including sidewalls and a bottom. The active trench extends through the well region and into the drift region and has at least portions of its sidewalls and bottom lined with dielectric material. The device further includes a first shield disposed within the active trench and separated from the sidewalls of the active trench by the dielectric material, a gate disposed within the active trench above the first shield and separated therefrom by inter-electrode dielectric material, and source regions having the first conductivity type formed in the well region adjacent the active trench. The gate is separated from the sidewalls of the active trench by the dielectric material. The first shield and the gate are made of materials having different work functions. In a variation, the first shield includes an N-type polysilicon and the gate includes P-type polysilicon. The drift region can be an epitaxially grown P-type material. The N-type polysilicon material in the first shield can provide an accumulation layer along the trench adjacent to the drift region. In another variation, the first shield includes an N-type polysilicon and the gate includes a metal. In still another variation, the first shield includes an P-type polysilicon and the gate includes N-type polysilicon. The drift region can be an epitaxially grown N-type material. The P-type polysilicon material in the first shield can provide an accumulation layer along the trench adjacent to the drift region. Details of these embodiments and variations are explained below with reference to the figures.

Figure 1:
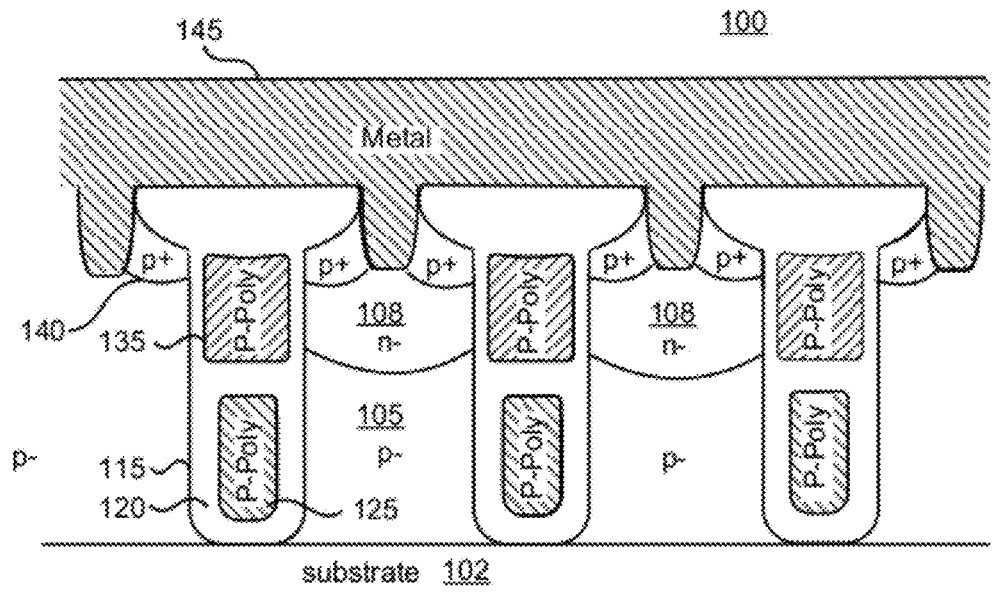
FIG. 1 is a cross-sectional view of a P-channel trench device with a gate and shield made of p-type polysilicon material disposed in a trench.

FIG. 1 is an illustration of a P-channel trench device 100 that includes a gate and a shield disposed inside of a trench, where the gate and the shield are both made of p-type polysilicon material. The trench device 100 includes a substrate 102, a drift region 105, a well region 108, an active trench 115, a dielectric material 120, a shield 125, a gate 135, source regions 140, and a metal layer 145. The dielectric material 120 lines the sidewalls and bottom of the trench 115 as well as separates the shield 125 from the gate 135. Both the shield 125 and the gate 135 are made of the same P-type polysilicon material. The P-channel device 100 uses the P type polysilicon to provide an appropriate work function to achieve threshold voltages in a range that is useful for operations (i.e. preventing channel accumulation at zero applied gate voltage). The shielded gate P-channel trench device 100, which uses a shielding polysilicon and gate polysilicon having the same dopant type of polysilicon, has an on-resistance which is high.

Figure 2A:
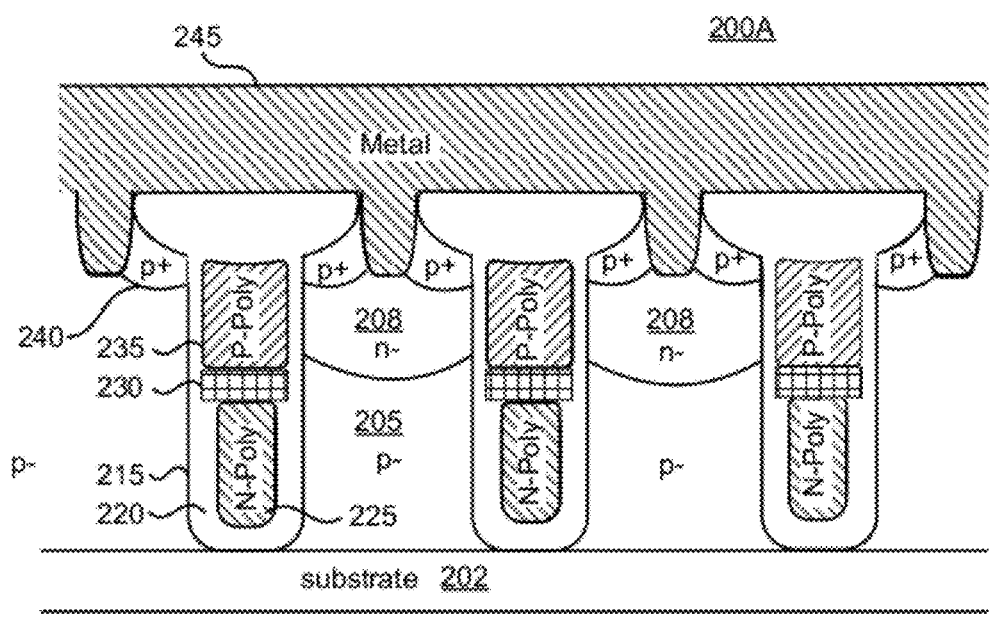
FIG. 2A is a cross-sectional view of a P-channel trench device with a p-type polysilicon gate and an n-type polysilicon shield disposed in a trench below the gate, where the trench extends to the substrate.

FIG. 2A illustrates a P-channel trench device 200A with a p-type polysilicon gate and an n-type polysilicon shield disposed in a trench below the gate. The P-channel trench device 200A, which is a charge balance structure, includes a gate polysilicon that is doped P-type and a shield polysilicon that is doped of opposite polarity (N-type) for the shield polysilicon. The N doping of the polysilicon in the shield region provides an accumulation layer along the trench in areas adjacent to the P epi region, thereby reducing the on-resistance of the device structure while maintaining threshold voltage requirements. In addition, it enables the formation of a thicker inter-electrode dielectric layer between the gate and shield poly, thereby making the gate of the device more rugged for maximum voltage rating. Ultra-portable applications, which use thinner gate oxide device also use thicker inter-electrode dielectric layers.

Trench device 200A includes a substrate 202, a drift region 205, a well region 208, an active trench 215, a dielectric material 220, a shield 225, an inter-electrode dielectric 230, a gate 235, source regions 240, and a metal layer 245. The drift region 205 has an epitaxial (p-type) layer that is formed over the lightly doped $p^+$ layer on substrate 202. The well region 208 has an n-type material that is formed over the drift region 205. The well region 208, which extends above the drift region 205, has a conductivity type opposite the conductivity type of the drift region 205. The active trench 215 is formed in the epitaxial (p-type) layer of the drift region 205 using etching techniques. The active trench can extend through the well region 208 and into the drift region 205. In some embodiments, the active trench can extend through the drift region into the substrate. Dielectric material 220 lines the sidewalls and bottom of the active trench 215. The sidewalls and bottom of the trench can be lined with a dielectric material by depositing or growing the dielectric material on the sidewalls and bottom of the trench. In one embodiment, a thin and conformal epitaxial (epi) layer can be grown. In another variation, the thickness and doping concentration can vary through the trench depth to improve the charge balance action in the drift region 205. Shield 225 is formed within the active trench 215 and includes an N-type polysilicon material, which is separated from the sidewalls and bottom of the active trench 215 by the dielectric material 220. The shield 225 can provide an accumulation layer along the active trench 215 adjacent to the drift region 205. The shield 225 can also be configured to be electrically biased to a desired potential. Inter-electrode dielectric 230 is formed over the shield 225 in the active trench 215. In one embodiment, the inter-electrode dielectric material 230 is thinner than the dielectric material 220. In this embodiment the distance between the gate 235 and the shield 225 is smaller than the distance between the trench 215 sidewalls and the gate 235, the distance between the trench 215 sidewalls and the shield 230, or the trench 215 bottom and the shield 230. In a variation, the inter-electrode 230 material can be deposited so that the inter-electrode dielectric material has a thickness that is thicker than the thickness of the dielectric material. In still another variation, the inter-electrode 230 material can be deposited so that the inter-electrode dielectric material has a thickness that is substantially similar or the same as the thickness of the dielectric material 220.

Gate 235 is formed within the active trench 215 above the shield 225 and separated therefrom by the inter-electrode dielectric 230 material. The gate 235 is also formed so that it is separated from the sidewalls of the active trench 215 by the dielectric material 220. The gate 235 can be formed to include a P-type polysilicon material in the active trench 215, or in another variation, a metal material in the active trench 215, as further discussed with reference to FIG. 2B. In some embodiments the gate 235 and the shield 225 are electrically coupled to substantially the same potential. This can be done by electrically connecting the gate 235 directly to the shield 225. The shield 225 and the gate 235 can have thicknesses and widths that vary. For example, the shield 225 can be thinner than the gate 235 or vice versa. Additionally, the shield 225 can have a smaller or larger width than gate 235. In one embodiment, gate 235 is wider than the shield 225 and the gate 235 overhangs the shield 225.

Source regions 240 are formed in the well region 208 adjacent the active trench 215. The source regions 240 can have a p+ conductivity type. In some embodiments the source regions 240 and the shield 225 are electrically coupled to substantially the same potential. This can be done by electrically connecting the source region 240 directly to the shield 225.

Shield 225 can also be connected to a power source to form a secondary gate electrode that is configured to be electrically biased to a desired potential. The gate 235 and the secondary gate electrode can also be independently electrically biased. For example, the secondary gate electrode can be biased at a constant potential at approximately the threshold voltage of the semiconductor device. In another variation, the secondary gate electrode can be biased at a potential that is greater than a potential applied to the source regions 240. In yet another variation, the secondary gate electrode can also be coupled to a potential at approximately the threshold voltage of the semiconductor device before a switching event.

Metal layer 245 can be deposited over the top portions of the device and is coupled to the source regions 240. The metal layer 245, which is connected to a source electrode (not shown) can include any conductive and/or semiconductive material such as, for example, any metal, silicide, polysilicon, or combinations thereof. The drain electrode (not shown) can be formed on the backside of the substrate 202. Trench device 200A can further include source, drain and gate electrodes for making contact with the gate region 235, source region 240 and drain region (not shown). Alternatively, trench device 200A can include a charge control trench that extends deeper into the drift region 205 than the active trench 215 and substantially filling the active trench 215 with material to allow for reduced On-resistance. Although trench device 200A is illustrated to include a p-type polysilicon gate 235 and an n-type polysilicon shield 225, other possible configurations are possible as further described below with reference to FIG. 2C.

Figure 2B:
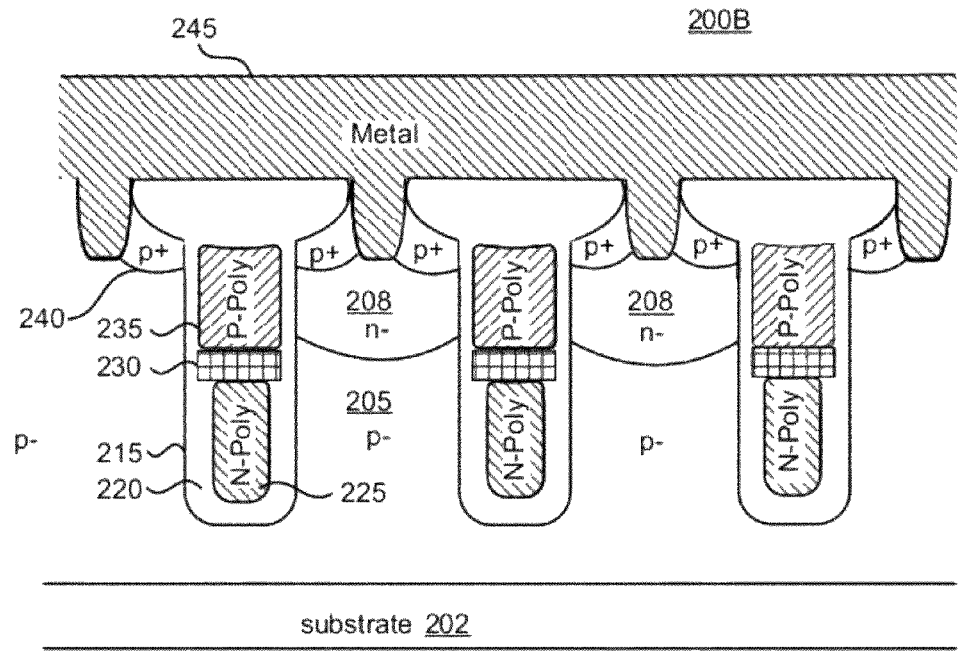
FIG. 2B is a cross-sectional view of a P-channel trench device with a p-type polysilicon gate and an n-type polysilicon shield disposed in a trench below the gate, where the trench extends into the drift region.

FIG. 2B illustrates a P-channel trench device 200B where the trenches 215 do not touch the substrate 202. Trench device 200B, which includes a substrate 202, a drift region 205, a well region 208, an active trench 215, a dielectric material 220, a shield 225, an inter-electrode dielectric 230, a gate 235, source regions 240, and a metal layer 245, is similar to trench device 200A except that the trenches 215 in trench device 200B extend only into the drift region 205 and do not reach or touch the substrate 202. Although trench device 200B is illustrated to include a p-type polysilicon gate 235 and an n-type polysilicon shield 225, other possible configurations are possible as further described below with reference to FIG. 2C.

Figure 2C:
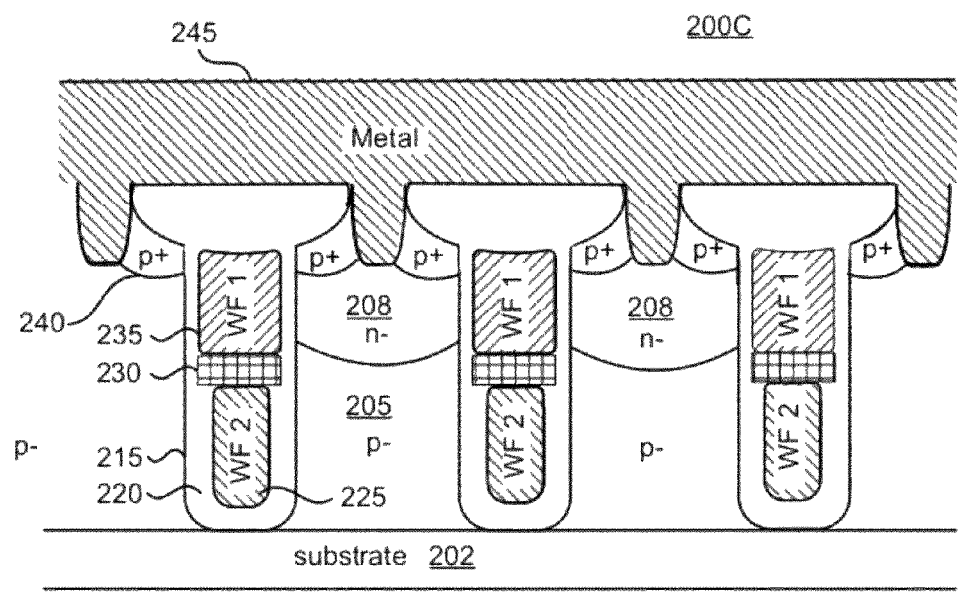
FIG. 2C is a cross-sectional view of a P-channel trench device with shield, which is made of a material having a first work function, disposed in a trench below a gate, which is made of a material have a second work function.

FIG. 2C illustrates a P-channel trench device 200C where the shield 225 is made of a material having a first work function (WF1) and the gate 235 is made of a material having a second work function (WF2). Trench device 200C, which includes a substrate 202, a drift region 205, a well region 208, an active trench 215, a dielectric material 220, a shield 225 made of a material having a first work function (WF1), an inter-electrode dielectric 230, a gate 235 made of a material having a second work function (WF2), source regions 240, and a metal layer 245, is similar to trench device 200A except that the shield 225 and gate materials 235 are broadly described in terms of work functions instead of doping. Trench devices 200A and 200B are each specific embodiments of trench device 200C. The shield 225 material and the gate 235 material have a WF1 and WF2, respectively, which are different. In one embodiment, WF1 is greater than WF2. In another embodiment WF2 is greater than WF1.

Figure 2D:
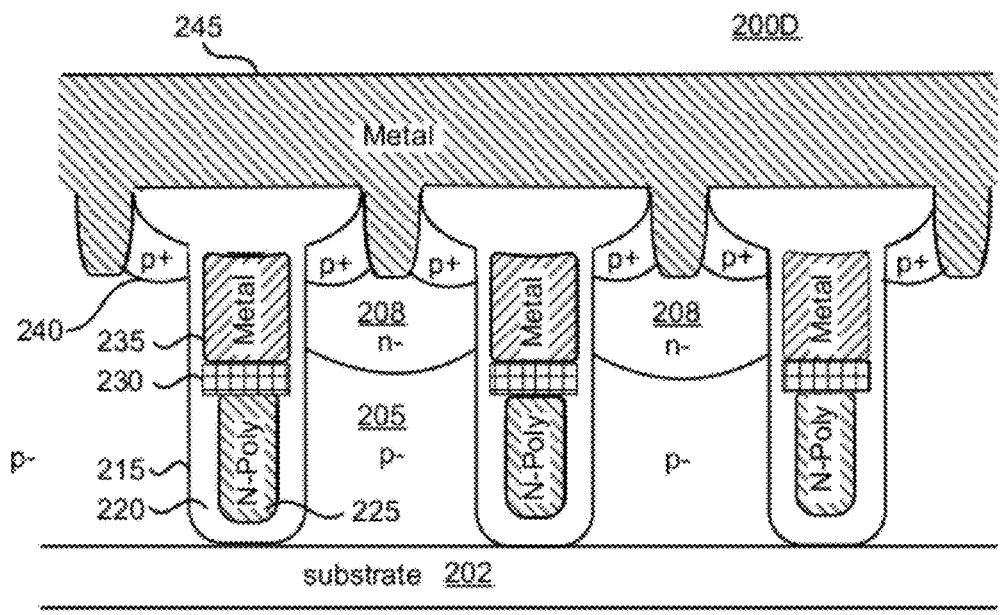
FIG. 2D is a cross-sectional view of a P-channel trench device with a metal gate and an n-type polysilicon shield disposed in a trench below the gate.

FIG. 2D illustrates a P-channel trench device 200D with a metal gate and an n-type polysilicon shield disposed in a trench below the gate. Trench device 200D, which includes a substrate 202, a drift region 205, a well region 208, an active trench 215, a dielectric material 220, a shield 225, an inter-electrode dielectric 230, a metal gate 235, source regions 240, and a metal layer 245, is similar to trench device 200A except that trench device 200D includes a metal gate whereas trench device 200A includes a p-type polysilicon gate.

Figure 2E:
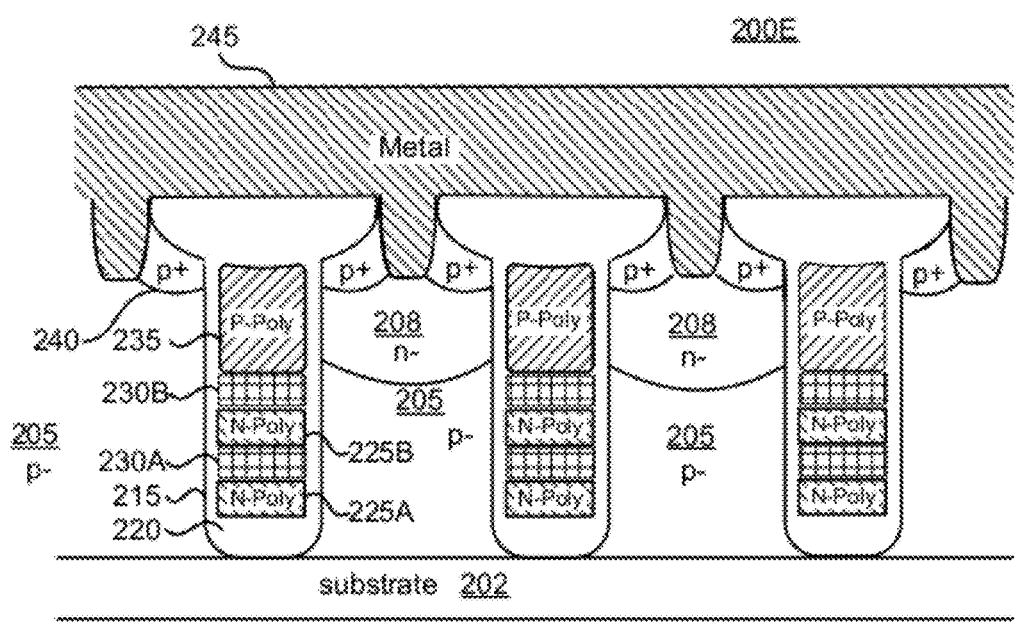
FIG. 2E is a cross-sectional view of a P-channel trench device with a p-type polysilicon gate and several n-type polysilicon shields disposed in a trench below the gate.

FIG. 2E illustrates a P-channel trench device 200E with a p-type polysilicon gate and several n-type polysilicon shields disposed in a trench below the gate. Trench device 200E, which includes a substrate 202, a drift region 205, a well region 208, an active trench 215, a dielectric material 220, a several shields 225A-225B, several inter-electrode dielectric 230A-230B, a gate 235, source regions 240, and a metal layer 245, is similar to trench device 200A except that trench device 200E includes several shields 225A-225B and several inter-electrode dielectrics 230A-230B, whereas trench device 200A includes a single shield 225 and a single inter-electrode dielectric 230. Trench device 200E includes a second shield 225B that is formed over a first shield 225A. In this embodiment, the first shield 225A is formed before the second shield 225B in the active trench 215 so that the first shield 225A is below the second shield 225B. The first shield 225A, the second shield 225B, and the gate 235 are separated by the inter-electrode dielectrics 230A-230B. The first inter-electrode dielectric 230A is formed over the first shield 225A. The second shield 225B is then formed over the first inter-electrode dielectric 230A. The second inter-electrode dielectric 230B layer is formed over the second shield 225B and the gate 235 is formed over the second inter-electrode dielectric 230B. In one embodiment, the first inter-electrode dielectric 230A and the second inter-electrode dielectric 230B can be substantially similar. In other embodiments, the first shield 225A and the second shield 225B have thicknesses and widths that vary. For example, the second shield 225B can be thinner than the first shield 225A or vice versa. Additionally, the second shield 225B can have a smaller or larger width than first shield 225A. In one embodiment, first shield 225A is wider than the second shield 225B and first shield 225A overhangs the second shield 225B. The first shield 225A and the second shield 225B can also both be made of N-type polysilicon material. The first shield 225A and the second shield 225B can each be connected to an independent power source so that the first shield 225A and the second shield 225B can be independently biased.

As with FIGS. 2A-2D, the dielectric material 220 lines the sidewalls and bottom of the trench 215 as well as separates the first shield 225A, the second shield 225B and the gate 235 from the trench 215 sidewalls. The first shield 225A is also separated from the trench 215 bottom by the dielectric material 220.

Figures 3A, 3B:
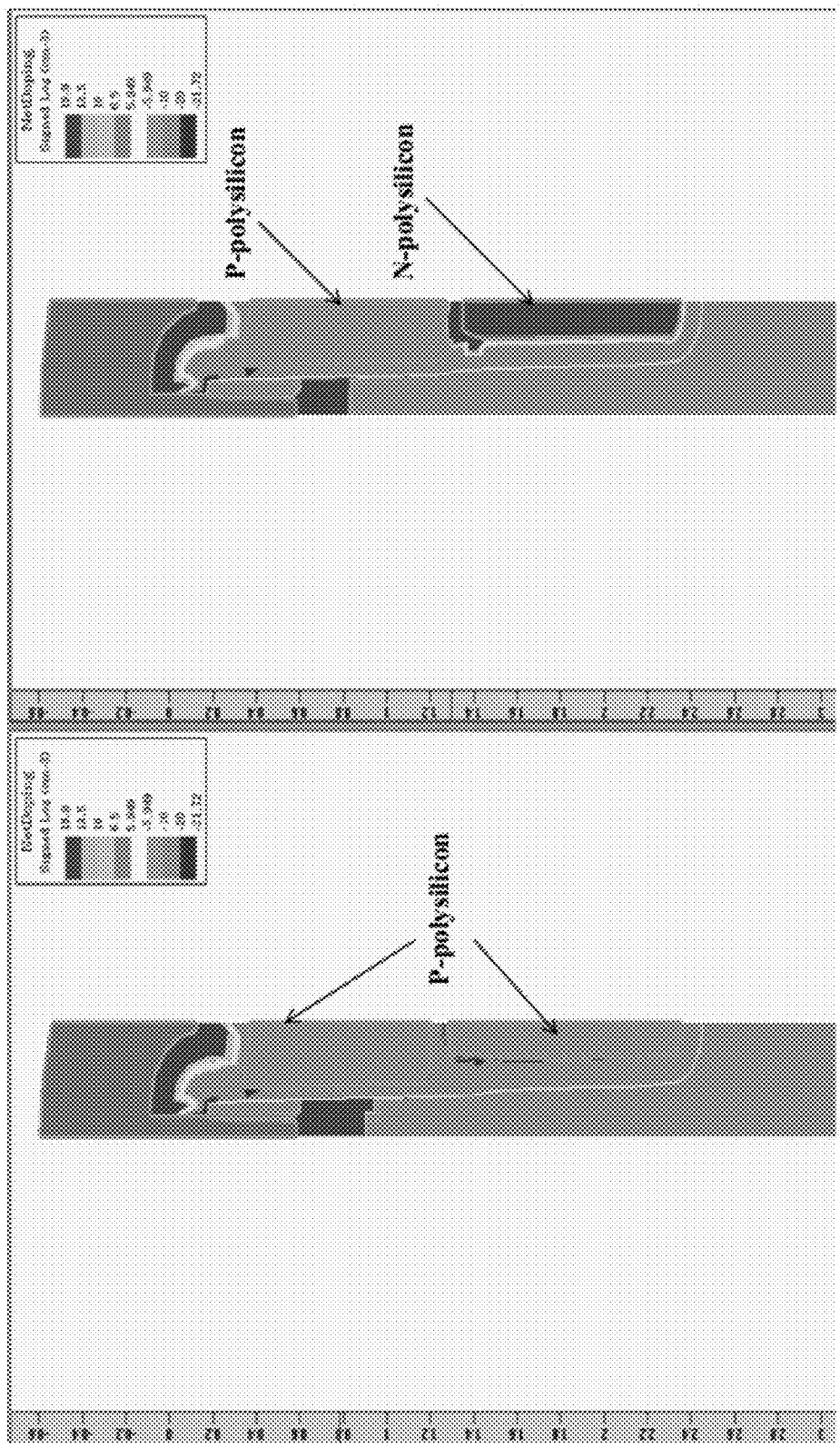
FIGS. 3A and 3B illustrate the doping profiles of the P-channel trench device illustrated in FIGS. 1 and 2, respectively.

FIG. 3A illustrates the doping profiles of the P-channel trench device 100 illustrated in FIG. 1. Trench device 100 includes a substrate 102, a drift region 105, a well region 108, an active trench 115, a dielectric material 120, a shield 125, a gate 135, source regions 140, and a metal layer 145. Shield 125 and gate 135, which are both P-type polysilicon material, are disposed within the trench 115 and are separated from each other by dielectric 130. In trench device 100 the doping profiles of the gate 135 and the shield 125 are both negative and both have doping concentration ranging from about $10^{-10}$ $cm^{-3}$ to about $10^{-20}$ $cm^{-3}$. Further the dielectric material 120, which lines the sidewalls and bottom of trench 115 and separates the gate 135 from the shield 125, also has a doping concentration profile that is negative and has a doping concentration ranges from about $10^{-10}$ $cm^{-3}$ to about $10^{-20}$ $cm^{-3}$. A simulation performed on trench device 100, which has a doping concentration profile as illustrated in FIG. 3A, has results as presented in Table 1.

TABLE 1

| Cell Pitch | ST3 (1.0 μm) | 1.0 μm | 0.8 μm |
|---|---|---|---|
| BV | 34.5 | 33.56 | 33.79 |
| Vth | 1.71 | 1.73 | 1.71 |
| Rsp10V | 0.171 | 0.091 | 0.067 |
| Rsp4.5V | 0.279 | 0.166 | 0.122 |
| % Reduction in Rsp10V vs. ST3 | NA | 47% | 61% |
| % Reduction in Rsp4.5V vs. ST3 | NA | 41% | 56% |
| Qgs | | 317 | 362 |
| Qgd | | 300 | 345 |
| Qg5V | | 821 | 870 |

FIG. 3B illustrates the doping profiles of the P-channel trench device 200 illustrated in FIG. 2A, which has a lower on resistance than the device illustrated in FIG. 1. Trench device 200A includes a substrate 202, a drift region 205, a well region 208, an active trench 215, a dielectric material 220, a shield 225, an inter-electrode dielectric 230, a gate 235, source regions 240, and a metal layer 245. Shield 225, which is N-type polysilicon material, and gate 235, which is P-type polysilicon material or metallic, are disposed within the trench 215 and are separated from each other by inter-electrode dielectric 230. In trench device 200 the doping profile of the shield 225 is positive and has a doping concentration that ranges from about $10^{-13.5}$ $cm^{-3}$ to about $10^{-19.9}$ $cm^{-3}$ whereas the doping profile of the gate 235 is negative and has a doping concentration ranging from about $10^{-10}$ $cm^{-3}$ to about $10^{-20}$ $cm^{-3}$. The dielectric material 220, which lines the sidewalls and bottom of trench 215, has a doping profile that is negative and has a doping concentration that ranges from about $10^{-10}$ $cm^{-3}$ to $10^{-20}$ $cm^{-3}$. The inter-electrode dielectric 230, which separates the gate 235 from the shield 225, is positive and has a doping concentration that ranges from about $10^{-13.5}$ $cm^{-3}$ to about $10^{-19.9}$ $cm^{-3}$. In one embodiment, the inter-electrode dielectric material 230 is thinner than the dielectric material 220. In this embodiment the distance between the gate 235 and the shield 225 is smaller than the distance between the trench 215 sidewalls and the gate 235, the distance between the trench 215 sidewalls and the shield 230, or the trench 215 bottom and the shield 230. In a variation, the spacing between the gate 235 and the shield 225 illustrated in FIG. 2A can be made larger than the spacing between the gate 135 and the shield 125 illustrated in FIG. 1. In this variation, the inter-electrode dielectric 230 can be made to be thicker than the dielectric material 120 deposited between the gate 135 and the shield 125. A simulation performed on trench device 200A, which has a doping concentration profile as illustrated in FIG. 3B, has results as presented in Table 2. A comparison of Tables 1 and 2 shows that the trench device 200A has a specific on-state resistance Rsp improvement over trench device 100 that goes up by as much as 4%.

TABLE 2

| Cell Pitch | ST3 (1.0 μm) | 1.0 μm | 0.8 μm |
|---|---|---|---|
| BV | 34.5 | 33.1 | 33.7 |
| Vth | 1.71 | 1.72 | 1.72 |
| Rsp10V (mohm * cm²) | 0.171 | 0.083 | 0.063 |
| Rsp4.5V (mohm * cm²) | 0.279 | 0.154 | 0.116 |
| % Reduction in Rsp10V vs. ST3 | NA | 51% | 63% |
| % Reduction in Rsp4.5V vs. ST3 | NA | 45% | 58% |
| Qgs (nC/cm²) | | 309 | 356 |
| Qgd (nC/cm²) | | 346 | 628 |
| Qg5V (nC/cm²) | | 742 | 712 |
| Qg10V (nC/cm²) | | 1647 | 1799 |

Figure 4A:
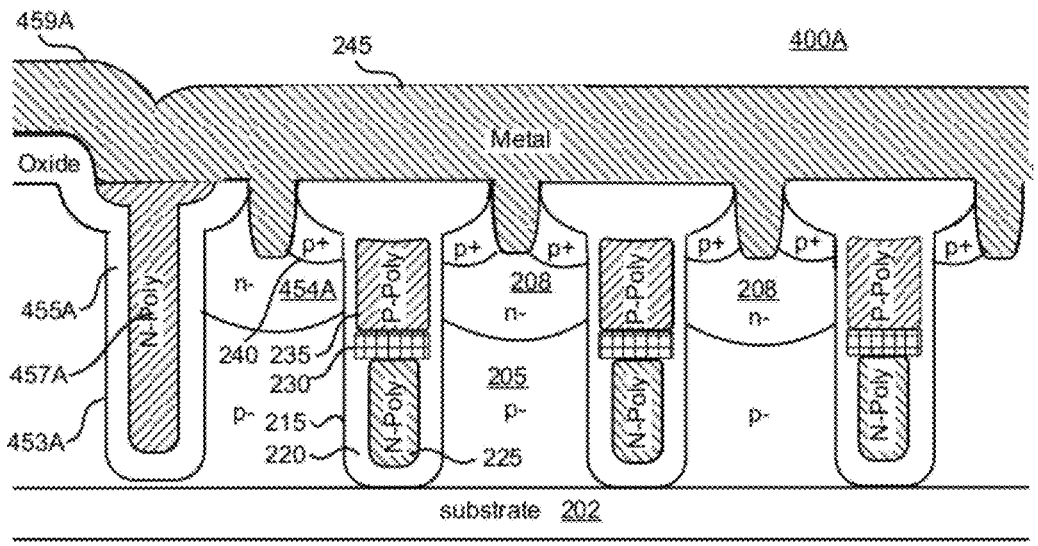
FIGS. 4A-4C are cross-sectional views of exemplary trench termination structures used with the P-channel trench device illustrated in FIG. 2A.
Figure 4B:
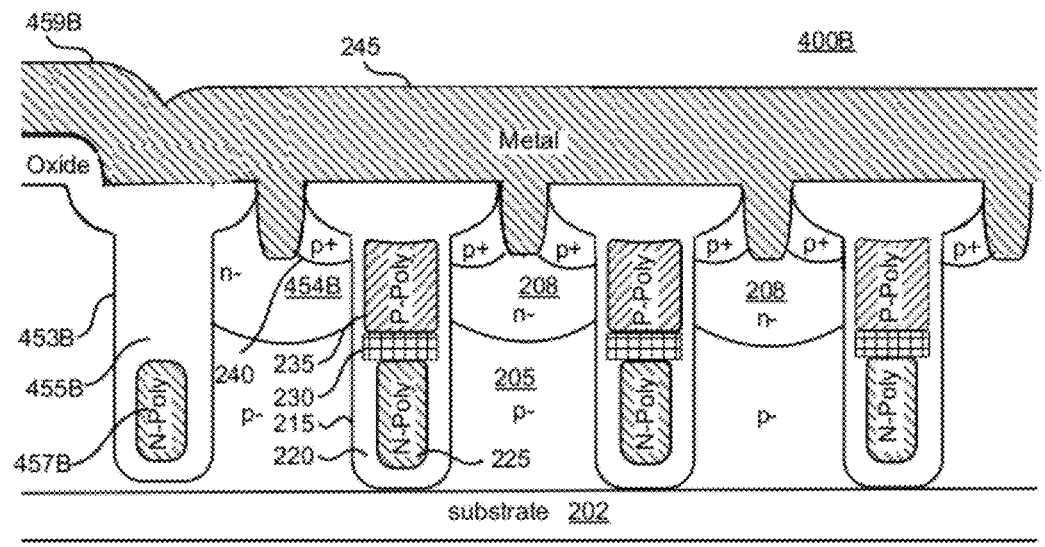
Figure 4C:
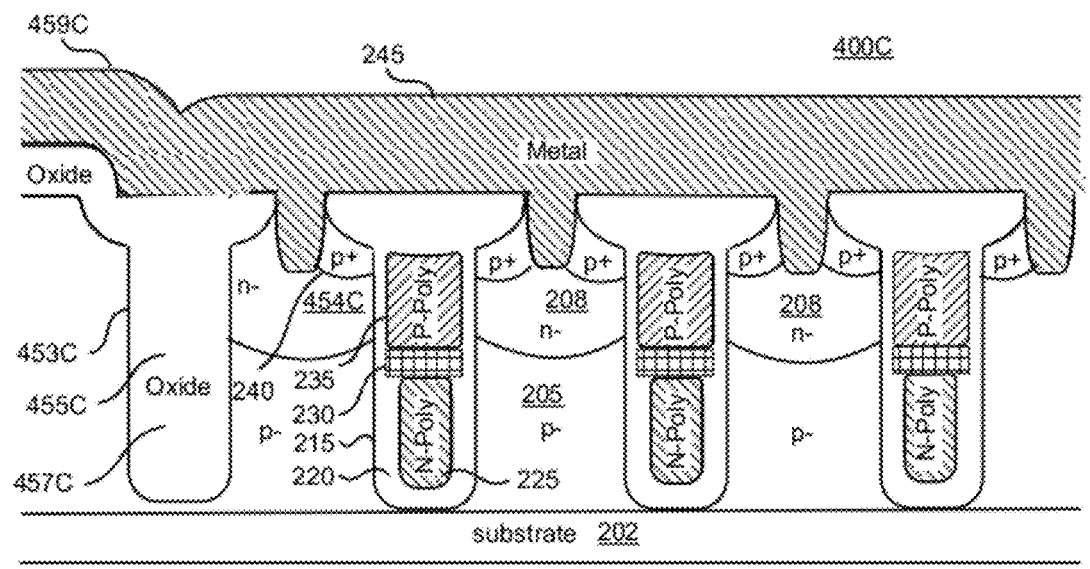

FIGS. 4A through 4C depict cross-sectional views of various exemplary trench termination structures for charge balanced P-channel trench MOSFET devices 400A that have a p-type polysilicon gate and an n-type polysilicon shield disposed below the gate in a trench. In the exemplary embodiment shown, MOSFET 400A includes a substrate 202, a drift region 205, a well region 208, an active trench 215, a dielectric material 220, a shield 225, an inter-electrode dielectric 230, a gate 235, source regions 240, and a metal layer 245. Shield 225, which is N-type polysilicon material, and gate 235, which P-type polysilicon material or metallic, are disposed within the trench 215 and are separated from each other by inter-electrode dielectric 230. In the embodiment shown in FIG. 4A, termination trench 453A is lined with a relatively thick layer of dielectric (oxide) 455A and filled with conductive material such as poly 457A. The poly 457A can have the same dopant as the shield 225. In the embodiment illustrated, the poly 457A has the same N-poly dopant material as the shield 225. The thickness of oxide layer 455A, the depth of termination trench 453A and the spacing between the termination trench and the adjacent active trench (i.e., width of the last mesa) are determined by the device reverse blocking voltage. In the embodiment shown in FIG. 4A, trenches are wider at the surface (T-trench structure) and a metal field plate 459A is used over the termination region. In an alternative embodiment (not shown), the field plate can be formed from polysilicon by extending poly 457A inside termination trench 453A above the surface and over the termination region (to the left of the termination trench in FIG. 4A). Many variations are possible. For example, a p+ region (not shown) under the metal contacts to silicon can be added for better Ohmic contact. P-well region 454 in the last mesa adjacent termination trench 453A and its respective contact can be optionally removed. Also, floating p-type region(s) can be added to the left of termination trench 453A (i.e., outside active area).

In another variation, instead of filling termination trench 453 with poly, a poly electrode is buried in the lower portion of the trench inside an oxide-filled trench. This embodiment is shown in FIG. 4B, wherein approximately half of termination trench 453B is filled with oxide 455B with the lower half having a poly electrode 457B buried inside the oxide. The poly 457B can have the same dopant as the shield 225. In the embodiment illustrated, the poly 457B has the same N-poly dopant material as the shield 225. The depth of trench 453B and height of buried poly 457B can be varied based on the device processing. In yet another embodiment shown in FIG. 4C, a termination trench 453C is substantially filled with dielectric with no conductive material buried therein. For all three embodiments shown in FIGS. 4A, 4B and 4C, the width of the last mesa separating the termination trench from the last active trench may be different than the width of a typical mesa formed between two active trenches, and can be adjusted to achieve optimal charge balancing in the termination region. All variations described above in connection with the structure shown in FIG. 4A can apply to those shown in FIGS. 4B and 4C. Further, those skilled in the art appreciate that while the termination structures have been described herein for a shielded gate device, similar structures can be implemented as termination regions for all the various trench based devices described above.

Figure 5:
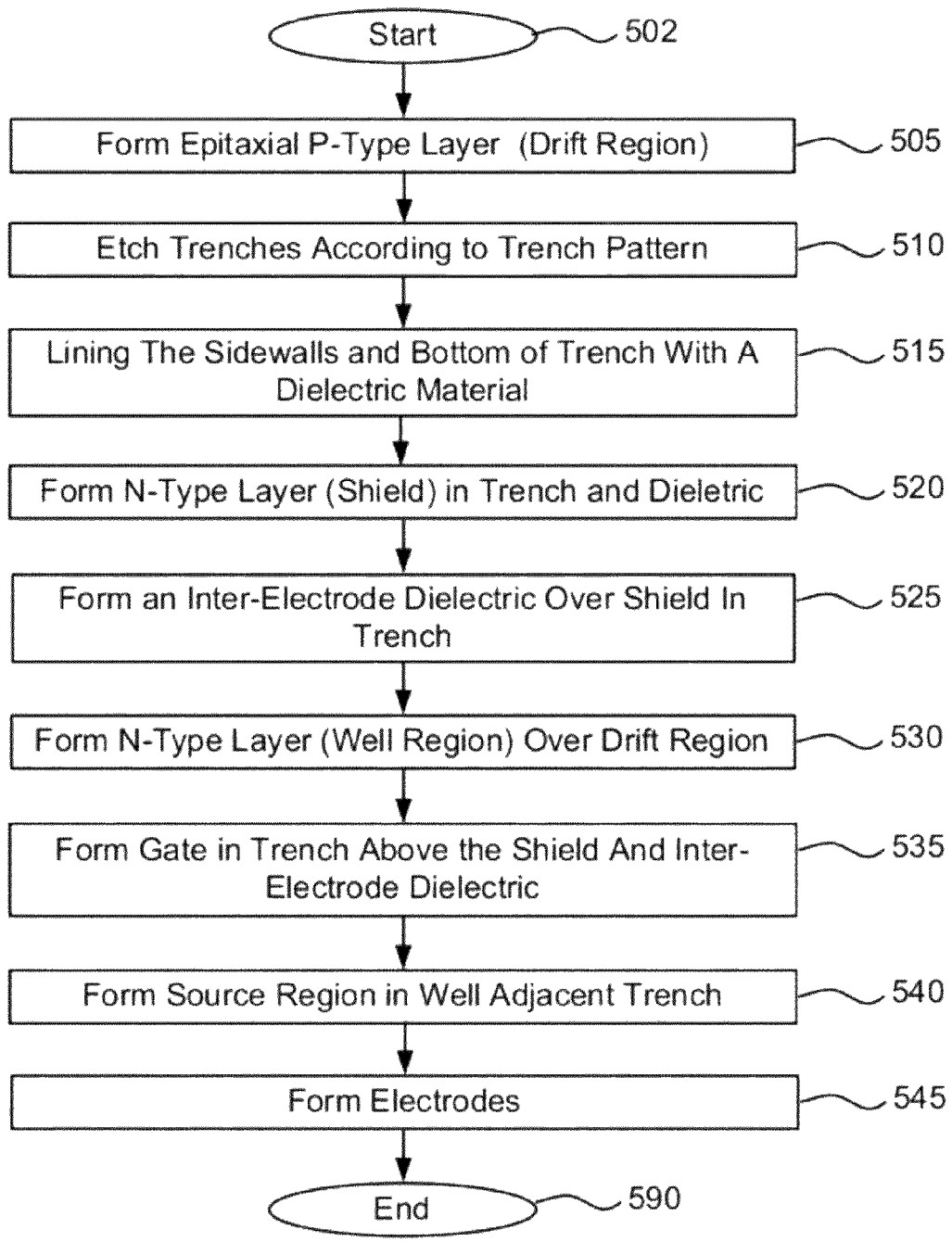
FIG. 5 is a flowchart illustrating a method of forming a P-channel trench MOSFET device with a p-type polysilicon gate and an n-type polysilicon shield disposed in a trench below the gate

FIG. 5 is a flowchart illustrating a method of forming a trench power MOSFET 200 with reduced On-resistance (as illustrated in FIGS. 2A-2C), in accordance with one embodiment. The method illustrated in FIG. 5 can be used to fabricate a P-channel trench charge balance MOSFET which is rugged and has a reduced on-resistance. The MOSFET includes a substrate 202, a drift region 205, a well region 208, an active trench 215, a dielectric material 220, a shield 225, an inter-electrode dielectric 230, a gate 235, source regions 240, and a metal layer 245. Shield 225, which is N-type polysilicon material, and gate 235, which P-type polysilicon material or metallic, are disposed within the trench 215 and are separated from each other by inter-electrode dielectric 230. The method starts in operation 502 when a substrate 202 having a lightly doped p+ layer is provided. In operation 505 a drift region 205 having an epitaxial (p-type) layer is formed over the lightly doped p+ layer on substrate 202. Next in operation 510, an active trench 215 is formed in the epitaxial (p-type) layer of the drift region 205 using etching techniques. The active trench can extend through the well region 208 and into the drift region 205. In some embodiments, the active trench can extend through the drift region into the substrate. In this operation, a hard mask can be grown and patterned over the epitaxial (p-type) layer of the drift region 205 before the active trench 215 is formed in the epitaxial (p-type) layer. The hard mask is removed after the active trench etch in case that the non-selective epi growth process is followed.

Next, in operation 515, the sidewalls and bottom of the trench are lined with a dielectric material 220. The sidewalls and bottom of the trench can be lined with a dielectric material by depositing or growing the dielectric material on the sidewalls and bottom of the trench. In one embodiment, a thin and conformal epitaxial (epi) layer can be grown. In another variation, the thickness and doping concentration can vary through the trench depth to improve the charge balance action in the drift region 205. In operation 520, a shield 225 is formed within the active trench 215. The shield 225, which includes an N-type polysilicon material, is separated from the sidewalls and bottom of the active trench 215 by the dielectric material 220. The shield 225 can provide an accumulation layer along the active trench 215 adjacent to the drift region 205. In one embodiment, the region in active trench 215 can be partially filled with N doped polysilicon shield 225 material to a predetermined height or can be completely filled with N-type polysilicon shield 225 material and then etched back to a predetermined height. Next in operation 525, an inter-electrode dielectric 230 material is formed over the shield 225 in the active trench 215. The inter-electrode 230 material can be formed using oxidation and/or deposition processes. In some embodiments, the inter-electrode dielectric material has a thickness that is thicker than the thickness of the dielectric material. In other variations, the inter-electrode 230 material can be formed so that the inter-electrode dielectric material has a thickness that is substantially similar or the same as the thickness of the dielectric material 220. In still another variation, the inter-electrode 230 material can be formed so that the inter-electrode dielectric material has a thickness that is thinner than the thickness of the dielectric material 220.

In other variations, more than one additional shields can be formed in the active trench below shield 225. The additional shields are formed before shield 225 in the active trench 215 so that the additional shields are below shield 225. The additional shields can also be formed using similar techniques used to form shield 225. In between the additional shields, inter-electrode dielectric layers are formed to separate the additional shields with a final inter-electrode layer on top of the last shield to separate the last shield from shield 225. The additional shields, which are separated by the inter-electrode materials, can be stacked over each other below the first shield. The additional shields can all also be made of N-type polysilicon material.

Next in operation 530, a well region 208 having an n-type material is formed over the drift region 205. The well region 208, which extends above the drift region 205, has a conductivity type opposite the conductivity type of the drift region 205. In operation 535, a gate 235 is formed within the active trench 215 above the shield 225 and separated therefrom by the inter-electrode dielectric 230 material. The gate 235 is also formed so that it is separated from the sidewalls of the active trench 215 by the dielectric material 220. The gate 235 can be formed to include a P-type polysilicon material in the active trench 215, or in another variation, a metal material in the active trench 215. In some embodiments the gate 235 and the shield 225 are electrically coupled to substantially the same potential. This can be done by electrically connecting the gate 235 directly to the shield 225. Next in operation 540, source regions 240 are formed in the well region 208 adjacent the active trench 215. The source regions 240 can have a p+ conductivity type. In some embodiments the source regions 240 and the shield 225 are electrically coupled to substantially the same potential. This can be done by electrically connecting the source region 240 directly to the shield 225.

In another embodiment, the shield 225 inside the active trench 215 can also be connected to a power source to form a secondary gate electrode that is configured to be electrically biased to a desired potential. The gate 235 and the secondary gate electrode can also be independently electrically biased. For example, the secondary gate electrode can be biased at a constant potential at approximately the threshold voltage of the semiconductor device. Alternatively, the secondary gate electrode can be biased at a potential that is greater than a potential applied to the source regions 240. Alternatively, the secondary gate electrode can also be coupled to a potential at approximately the threshold voltage of the semiconductor device before a switching event.

In operation 545 the source, drain and gate electrodes are formed. The source electrode which includes the metal layer 245 can be deposited over the top portions of the device. The source electrode can include any conductive and/or semiconductive material such as, for example, any metal, silicide, polysilicon, or combinations thereof. The drain electrode can be formed on the backside of the substrate 202 and can be formed before or after the source electrode region has been formed. In some embodiments, the drain can be formed on the backside by thinning the backside of the substrate 202 using processes such as grinding, polishing, or etching. A conductive layer can then be deposited on the backside of the substrate 202 until the desired thickness of the conductive layer of the drain is formed. Finally, in operation 590, the trench power MOSFET with reduced On-resistance is completed. The method can alternatively provide for forming a charge control trench that extends deeper into the drift region than the active trench and substantially filling the active trench with material to allow for reduced On-resistance.

Although specific embodiments of the invention have been described, various modifications, alterations, alternative constructions, and equivalents are also encompassed within the scope of the invention. The described invention is not restricted to operation within certain specific embodiments, but is free to operate within other embodiments configurations as it should be apparent to those skilled in the art that the scope of the present invention is not limited to the described series of transactions and steps.

It is understood that all material types provided herein are for illustrative purposes only. Accordingly, one or more of the various dielectric layers in the embodiments described herein may comprise low-k or high-k dielectric materials. As well, while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A semiconductor device comprising:
a drift region of a first conductivity type;
a well region extending above the drift region and having a second conductivity type opposite the first conductivity type;
an active trench comprising sidewalls and a bottom, the active trench extending through the well region and into the drift region and having at least portions of its sidewalls and bottom lined with dielectric material;
a first shield disposed within the active trench and separated from the sidewalls of the active trench by the dielectric material;
a gate disposed within the active trench above the first shield and separated therefrom by inter-electrode dielectric material, the gate being separated from the sidewalls of the active trench by the dielectric material; and
source regions having the first conductivity type formed in the well region adjacent the active trench, wherein the first shield and the gate are made of materials having different work functions.

2. The semiconductor device of claim 1 wherein the first shield comprises an N-type polysilicon and the gate comprises P-type polysilicon.

3. The semiconductor device of claim 2 wherein the drift region is an epitaxially grown P-type material.

4. The semiconductor device of claim 2 wherein an N-type polysilicon material in the first shield provides an accumulation layer along the trench adjacent to the drift region.

5. The semiconductor device of claim 1 wherein the first shield comprises an N-type polysilicon and the gate comprises a metal.

6. The semiconductor device of claim 1 wherein the first shield comprises P-type polysilicon and the gate comprises N-type polysilicon.

7. The semiconductor device of claim 6 wherein the drift region is an epitaxially grown N-type material.

8. The semiconductor device of claim 6 wherein the P-type polysilicon in the first shield provides an accumulation layer along the trench adjacent to the drift region.

9. The semiconductor device of claim 1 wherein the drift region is formed over a substrate and the active trench extends into the substrate.

10. The semiconductor device of claim 1 wherein the first shield and the gate are configured to be electrically coupled to substantially the same potential.

11. The semiconductor device of claim 1 wherein:
the first shield comprises an N-type polysilicon;
the gate comprises P-type polysilicon;
the active trench further comprises a second shield; and
the second shield comprises an N-type polysilicon material disposed below the first shield.

12. The semiconductor device of claim 1 wherein:
the first shield comprises an N-type polysilicon;
the gate comprises P-type polysilicon; and
the active trench further comprises a plurality of second shields disposed below the first shield, the plurality of second shields being stacked below the first shield.

13. The semiconductor device of claim 1 wherein the shield inside the active trench forms a secondary gate electrode that is configured to be electrically biased to a desired potential.

14. The semiconductor device of claim 13 wherein the gate and the secondary gate electrode are configured to be independently electrically biased.

15. The semiconductor device of claim 14 wherein the secondary gate electrode is configured to be biased at a constant potential at approximately a threshold voltage of the semiconductor device.

16. The semiconductor device of claim 14 wherein the secondary gate electrode is configured to be biased at a potential that is greater than a potential applied to the source regions.

17. The semiconductor device of claim 14 wherein the secondary gate electrode is configured to be coupled to a potential at approximately a threshold voltage of the semiconductor device before a switching event.

18. The semiconductor device of claim 13 wherein the active trench further comprises a third conductive layer disposed under the secondary gate electrode, the third conductive layer being isolated from the secondary gate electrode and the trench sidewalls and bottom by dielectric material, the third conductive layer forming a shield electrode that is configured to be electrically biased to a desired potential.

19. A semiconductor device comprising:
a drift region of an epitaxially grown P-type conductivity material;
a well region extending above the drift region and having an n-type conductivity material;
an active trench comprising sidewalls and a bottom, the active trench extending through the well region and into the drift region, the active trench having at least portions of its sidewalls and bottom lined with dielectric material;
a first shield disposed within the active trench and separated from the sidewalls of the active trench by the dielectric material, the first shield comprising an N-type polysilicon material;
a gate disposed within the active trench above the first shield and separated therefrom by inter-electrode dielectric material, the gate being separated from the sidewalls of the active trench by the dielectric material, the gate comprises a material different than the first shield material; and
source regions having a P-type conductivity formed in the well region adjacent the active trench.

20. The semiconductor device of claim 19 wherein the drift region is formed over a substrate and the active trench extends into the substrate.

21. The semiconductor device of claim 19 wherein the gate comprises a metal material.

22. The semiconductor device of claim 19 wherein the N-type polysilicon material in the first shield provides an accumulation layer along the trench adjacent to the drift region.

23. The semiconductor device of claim 19 wherein the inter-electrode dielectric material has a thickness that is thicker than the dielectric material.

24. A method of forming a semiconductor device comprising:
   forming a drift region of a first conductivity type;
   forming an active trench extending through a well region and into the drift region, the active trench comprising sidewalls and a bottom;
   lining portions of sidewalls of the active trench and a bottom of the active trench with a dielectric material;
   forming a shield comprising an N-type polysilicon material within the active trench and separated from the sidewalls of the active trench by the dielectric material;
   forming an inter-electrode dielectric material over the shield in the active trench;
   forming a well region extending above the drift region, the well region having a second conductivity type opposite the first conductivity type;
   forming a gate within the active trench above the shield and separated therefrom by the inter-electrode dielectric material, the gate being separated from the sidewalls of the active trench by the dielectric material, the gate comprises a material different than the shield material; and
   forming source regions in the well region adjacent the active trench, the source regions having the first conductivity type.

25. The method of claim 24 wherein the drift region is formed over a substrate and the active trench is formed to extend into the substrate.

26. The method of claim 24 wherein forming the gate comprises forming a P-type polysilicon material in the active trench.

27. The method of claim 24 wherein forming the shield comprising an N-type polysilicon material provides an accumulation layer along the trench adjacent to the drift region.

28. The method of claim 24 wherein forming an inter-electrode dielectric material further comprises depositing the inter-electrode dielectric material that has a thickness that is thicker than the dielectric material.

29. The method of claim 24 wherein forming an inter-electrode dielectric material further comprises using oxidation.

30. The method of claim 24 wherein forming an inter-electrode dielectric material further comprises using oxidation and deposition.

* * * * *